United States Patent [19]

Toyooka et al.

[11] Patent Number: 4,519,049
[45] Date of Patent: May 21, 1985

[54] MAGNETIC BUBBLE MEMORY HAVING AUXILIARY STORAGE LOOPS

[75] Inventors: Takashi Toyooka, Sayama; Hirokazu Aoki, Hachioji; Mamoru Sugie, Sayama, all of Japan

[73] Assignee: Hitachi, Ltd., Tokyo, Japan

[21] Appl. No.: 446,510

[22] Filed: Dec. 3, 1982

[30] Foreign Application Priority Data

Dec. 4, 1981 [JP] Japan .............................. 56-194521

[51] Int. Cl.³ ............................................. G11C 19/08
[52] U.S. Cl. ........................................ 365/12; 365/15
[58] Field of Search .............................. 365/15, 16, 12

[56] References Cited

U.S. PATENT DOCUMENTS

| 4,152,777 | 5/1979 | Baker | 365/15 |
| 4,321,693 | 3/1982 | Naden | 365/15 |
| 4,326,268 | 4/1982 | Suzuki et al. | 365/12 |

OTHER PUBLICATIONS

IEEE Transactions on Magnetics-vol. MAG-17, No. 6, Nov. 1981; pp. 3038-3040.
IBM Technical Disclosure Bulletin-vol. 23, No. 7B, Dec. 1980, pp. 3450-3452.

Primary Examiner—James W. Moffitt
Attorney, Agent, or Firm—Antonelli, Terry & Wands

[57] ABSTRACT

A magnetic bubble memory has a plurality of minor loops for storing data represented by magnetic bubble sequences, a write line for transferring write data to couple them to the minor loops and a read line for transferring read data to a bubble detector. The read line is coupled to a plurality of auxiliary loops through replicators and the auxiliary loops are coupled to the minor loops through replicators. The data replicated to the auxiliary loops are read out.

12 Claims, 5 Drawing Figures

MAGNETIC BUBBLE MEMORY HAVING AUXILIARY STORAGE LOOPS

BACKGROUND OF THE INVENTION

1. Field of the Invention

The present invention relates to a magnetic memory which accesses stored data by the presence or absence of cylindrical magnetic bubble domains or so-called magnetic bubbles, and more particularly to such a magnetic memory having a plurality of minor loops, a write line and a read line.

2. Description of the Prior Art

In a magnetic bubble memory, information is stored by a "1" or "0" signal represented by the presence or absence of a cylindrical magnetic domain called a magnetic bubble which can be stably present in a magnetic thin film under a biasing magnetic field of 50–500 Oersteads perpendicular to a chip plane. The magnetic bubble representing the information is usually stored in a propagation track of a loop configuration.

A typical example thereof is described in detail in an article "68K Bit Capacity 16 μm-Period Magnetic Bubble Memory Chip Design with 2 μm Minimum Feature" IEEE Transaction on Magnetics, Vol. MAG-12, No. 6, pages 614–617.

In the above magnetic bubble memory, a plurality of minor loops each comprising a propagation track for propagating magnetic bubbles in response to a driving magnetic field rotating in a chip plane are arranged, and a write line having a function to write information in the minor loops is arranged at one end of the minor loops while a read line having a function to read out the information stored in the minor loops is arranged at the other end of the minor loops.

In such a memory chip arrangement, in order to increase a memory capacity, it is necessary to increase the number of bits in each of the minor loops. When the number of minor loops is increased, the number of bits in the write line and the read line increase accordingly.

On the other hand, since there is a limit in shortening a rotation cycle of the driving magnetic field which drives the bubble memory, an access time and a cycle time of the memory increase as the capacity of the memory chip increases and they are substantially proportional to a square root of the memory chip capacity.

SUMMARY OF THE INVENTION

It is an object of the present invention to provide a magnetic bubble memory which can shorten a read access time and preferably also a write access time when the number of bits in each of minor loops is increased to provide a large capacity memory chip.

It is another object of the present invention to provide a magnetic bubble memory which can shorten a write cycle time.

In accordance with one aspect of the present invention, in a magnetic bubble memory having a plurality of minor loops, a write line having a function to write a data stream in the minor loops and a read line having a function to read the data stream stored in the minor loops, an auxiliary loop is arranged between each of the minor loops and the read line, the minor loops and the auxiliary loops are connected by replicators, and the auxiliary loops and the read line are connected by replicators.

DESCRIPTION OF THE PREFERRED EMBODIMENTS

Figure 1:
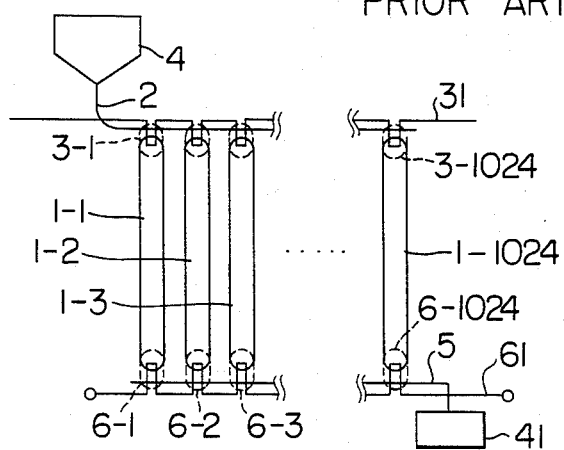
FIG. 1 shows a loop configuration of a prior art magnetic bubble memory.

Before the description of the embodiments of the present invention, a possible configuration and a problem thereof in a large capacity (for example 4M-bits) memory according to the prior art are discussed. FIG. 1 shows a loop configuration of such a prior art magnetic bubble memory. It has 1024 minor loops 1-1, 1-2, ... 1-1024 and each of the minor loops has a propagation pattern capable of holding 4096 bubbles. When a driving magnetic field rotates one revolution, each bubble is moved from a pattern to one-bit ahead pattern on the propagation track. Thus, 4096 driving magnetic field cycles are required to circulate data around a minor loop. A read line 2 is arranged in proximity to one end of each minor loop. The read line 2 and the minor loops 1-1 to 1-1024 are coupled by replicators 3-1 to 3-1024 respectively. The replicators 3-1 to 3-1024 are driven by an appropriate pulse current through a control line 31 and replicates the data in the minor loops on the read line 2. Magnetic bubbles, which come out on the read line 2 by the replication action, are propagated to a magnetic bubble detector 4. The magnetic bubble detector 4 converts the presence or absence of magnetic bubbles into electric signals. Thus the data stored in minor loops 1-1 to 1-1024 are read out non-destructively.

Magnetic bubbles to be stored in the minor loops 1-1 to 1-1024 are generated by a magnetic bubble generator 41. The magnetic bubbles are propagated through the write line 5. The minor loops 1-1 to 1-1024 are coupled to the write line 5 by swap gates 6-1 to 6-1024, respectively. The swap gates are driven by an appropriate pulse current through a control line 61 and exchange (swap) the data on the write line 5 and on the minor loops 1-1 to 1-1024. Thus new data are stored in the minor loops.

Reference is also made for the respective elements of magnetic bubble memory to the article "68K Bit Capacity 16 μm-Period Magnetic Bubble Memory Chip Design with 2 μm Minimum Feature" IEEE Transaction on Magnetics, Vol. MAG-12, No. 6, pages 614–617.

Averages of an access time and a cycle time for the reading and an average of a cycle time for the writing for the 4M bits memory chip shown in FIG. 1 when it is operated by the driving magnetic field frequency of 100 KHz are shown in Table 1.

TABLE 1

| | | |
|---|---|---|
| | Read Access Time | 21.48 msec |
| | Read Cycle Time | 41.96 msec |
| | Write Cycle Time | 42.96 msec |

EMBODIMENT 1

Figure 2:
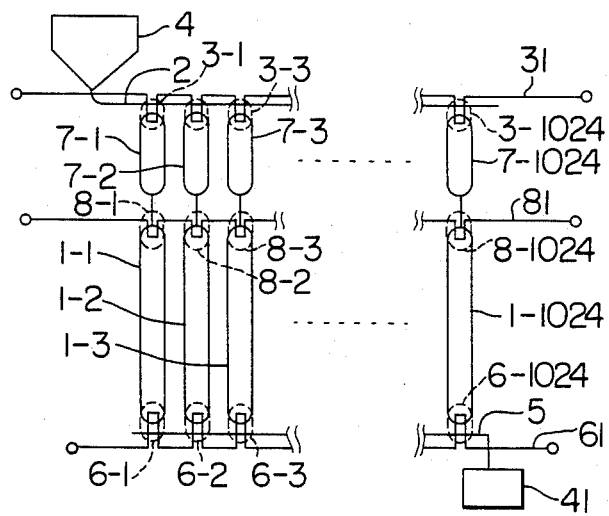
FIG. 2 shows a loop configuration of one embodiment of the present invention.

FIG. 2 shows an embodiment of the magnetic bubble memory of the present invention. There are arranged 1024 auxiliary loop 7-1 to 7-1024 each associated with a corresponding one of 1024 minor loops 1-1 to 1-1024 by one of replicators 8-1 to 8-1024 and with a read line 2 by one of replicators 3-1 to 3-1024. The replicators are driven by a pulse current through the control line 81. The number of bits of each auxiliary loop is 128. Similar reference symbols as in FIG. 1 represent similar parts.

Figure 3:
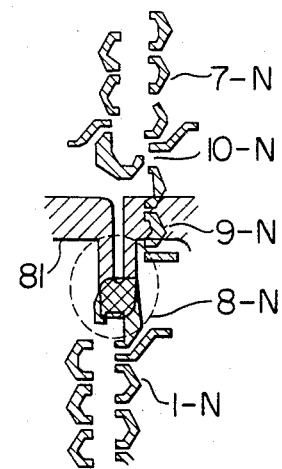
FIG. 3 shows a partial pattern of FIG. 2.

FIG. 3 shows a pattern of connection of the minor loop and the auxiliary loop shown in FIG. 2. The auxiliary loop 7-N and the minor loop 1-N are connected by a replicator 8-N at an upper end of the minor loop 1-N. In the replicator 8-N, a hairpin shaped portion of the control line 81 extends over a minor loop 1-N and transfer path 9-N. The transfer path 9-N is connected to auxiliary loop 7-N at a merging circuit 10-N. The replicator 8-N divides a magnetic bubble at the top of the minor loop 1-N into two magnetic bubbles by an appropriate pulse current through the control line 81. One of the divided magnetic bubbles is left in the minor loop 1-N, and the other is transferred through the transfer paths 9-N to the auxiliary loop 7-N. Thus a replication of a data is performed. The replicators 8-1 to 8-1024 in FIG. 2 are similarly operated at a desired timing and the bubbles picked up by the replicators are supplied to the auxiliary loops 7-1 to 7-1024. By this arrangement, the data at 128 addresses in the 1024 minor loops can be copied and stored in the auxiliary loops. For example, in order to store the data at the addresses 1 to 128 into the auxiliary loop, the replicators are consecutively operated for 128 driving magnetic field cycles starting from a time point when the bubbles corresponding to the address 1 on the minor loops appear under the replicators 8-1 to 8-1024. Prior to this operation, it is necessary to operate the replicators 3-1 to 3-1024 as transfer-out gates in order to remove the bubbles from the auxiliary loops. The replicators 3-1 to 3-1024 may have similar structure as shown in FIG. 3 and can operate also as transfer-out gates and remove bubbles from the auxiliary loops 7-1 to 7-1024 to the read line 2, being driven by a pulse current applied to the control line 31 at slightly earlier timing than that for application operation. Such early timing will transfer the bubble in the auxiliary loop into the read line but leave no bubble in the auxiliary loop. By holding the copy in the auxiliary loop, the data at the addresses 1 to 128 can be read from the auxiliary loop through the replicator 3 so that an average read access time is shortened to 2.64 msec and an average read cycle is shortened to 12.88 msec. To compare with the access time without the auxiliary loop shown in Table 1, it is reduced by approximately 20 msec.

In order to read the data at the address not stored in the auxiliary loop, the replicator 8 is operated to move the bubbles into the auxiliary loop 7. Each 64-bits data in the minor loop may be transferred to the auxiliary loop at each renewal. Then, the replicator 3 is operated to read a desired data. Accordingly, the read access time becomes longer than that of the prior art shown in Table 1 by a time required to transfer by 67 bits. That is, it is 22.15 msec. The read cycle is 42.63 msec.

It may be recalled that for reading the data at the address not stored in the auxiliary loop, the old bubbles having been stored in the auxiliary loop are removed by the replicator 3. This operation can be completed before the data at the desired address in the minor loop appears under the replicator 8. In order to replicate new data into the auxiliary loop, the data near the desired address may be sequentially replicated. For example, when the address of the data to be newly read is 129, not only this data is replicated into the auxiliary loop, but all of the data at the addresses 129 to 256 may be replicated into the auxiliary loop while the data at the address 129 is moved to a bubble detector 4 through the read line 2.

Figure 4:
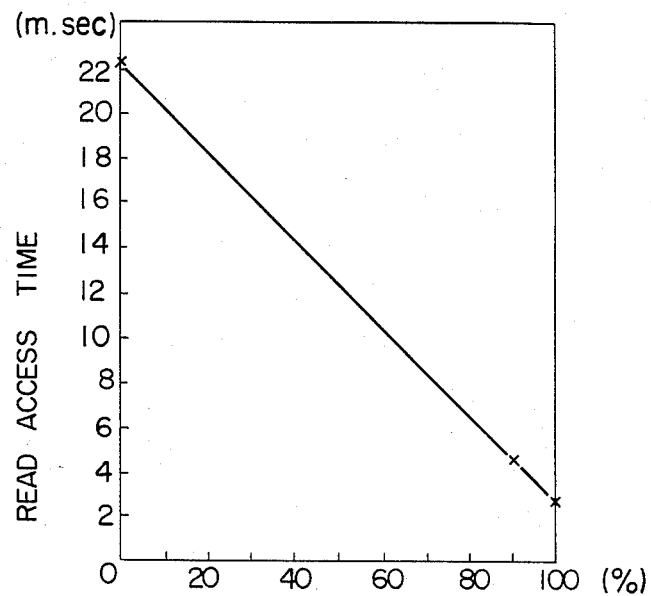
FIG. 4 shows an access time in the embodiment of FIG. 2.

In actual memory read operation, there is a tendency of localization and a probability of reading the data at the address near the formerly accessed address is high. Accordingly, a probability of reading the data at the 128 addresses in the auxiliary loop of the memory chip is high, for example 90%. In this case, an effective read time is an average of the time required to read the data stored in the auxiliary loop and the time necessary to read the data not stored in the auxiliary loop, weighted by factors of 9 and 1, respectively. That is, $2.64 \times 0.9 + 22.15 \times 0.1 = 4.591$ msec. Accordingly, by providing the auxiliary loop, the average read access time is 0.21 times of the access time 21.48 msec for the prior art. This value depends on the localization of the read data. When the probability of reading the data at the 128 addresses changes between 10% and 100%, it changes as shown in FIG. 4.

As discussed above, when there exists the data localization, the access time can be considerably reduced by providing the auxiliary loops. In order to facilitate the operation of a control circuit, it is preferred that the number of bits in the minor loop is an integer multiple of the number of bits in the read auxiliary loop.

EMBODIMENT 2

Figure 5:
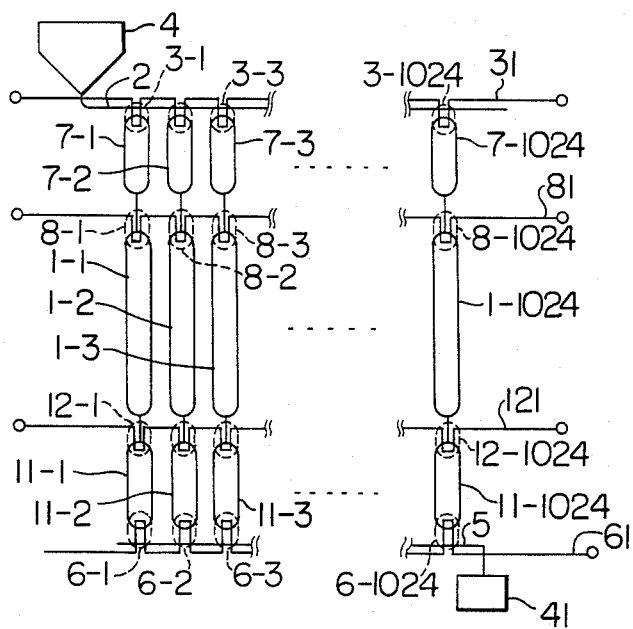
FIG. 5 shows a loop configuration of another embodiment of the present invention.

Another embodiment of the present invention shown in FIG. 5 comprises the memory chip including the block replicators 3-1 to 3-1024 and 8-1 to 8-1024 and the 1024 auxiliary loops 7-1 to 7-1024, as shown in FIG. 2 and additional write auxiliary loops 11-1 to 11-1024 and swap gates 12-1 to 12-1024 associated with a control line 121. This arrangement can substantially reduce the write cycle time. A data stream of bubbles generated by a generator 41 is written into the address of one of the auxiliary write loops 11-1 to 11-1024 through the swap gates 6-1 to 6-1024 by the control signal on the line 61 to complete the write operation. The auxiliary loop 11-N and the minor loop 1-N are also connected through the swap gate 12-N and the data stream of the bubbles is moved from the auxiliary loops 11-N to the minor loop 1-N by applying current pulses to the control line 121 at an appropriate timing after the write operation. Assume that the number of bits in each minor loop is 4096 and the number of bits in each write auxiliary loop is 128. Thus, when the data is to be written at a certain address in the minor loop, the data is written at an address of the write auxiliary loop which corresponds to such a residue that is obtained by dividing said certain address by 128. After the write operation, the swap gate is activated at a timing when the desired address appears under the swap gate 12. In this manner, the write cycle time (excluding the operation of the last swap gate 12) is shortened to 22.48 msec which is approximately 20 msec shorter than that of the prior art without the auxiliary loop.

In the above operation, in order to activate the swap gate as soon as possible to move the bubble sequence to an address in the minor loop, it is preferable that the number of bits of the minor loop is an integer multiple of the number of bits of the write auxiliary loop.

We claim:

1. A magnetic bubble memory for accessing stored data sequences by the presence or absence of magnetic bubble domains, comprising:
    a plurality of minor loops for circulating the stored data sequences;
    data updating means coupled to said plurality of minor loops for updating the data sequences;
    first replicator means for replicating the data sequences of said plurality of minor loops;
    a plurality of auxiliary loops coupled to said first replicator means for ciculating the replicated data sequences;
    a read line for transferring the data sequences to be read from said auxiliary loops; and
    second replicator means coupled to said read line and said auxiliary loops and for replicating the data in said auxiliary loops to said read line.

2. A magnetic bubble memory according to claim 1 wherein the number of bits of each of said minor loops is an integer multiple of the number of bits of each of said auxiliary loops.

3. A magnetic bubble memory according to claim 1 wherein said data updating means includes magnetic bubble domain generating means, a write line coupled to said magnetic bubble domain generating means and gate means for coupling said write line and said plurality of minor loops to control data transfer therebetween.

4. A magnetic bubble memory according to claim 1 wherein said data updating means includes magnetic bubble domain generating means, a write line coupled to said magnetic bubble domain generating means, a plurality of write auxiliary loops arranged one for each of said plurality of minor loops for circulating the data sequences, first gate means for coupling said write line and one end of each of said plurality of write auxiliary loops to control data transfer therebetween and second gate means for coupling the other end of each of said plurality of write auxiliary loops and said plurality of minor loops to control data transfer therebetween.

5. A magnetic bubble memory according to claim 4 wherein the number of bits of each of said minor loops is an integer multiple of each of said auxiliary loops.

6. A magnetic bubble memory according to claim 1, wherein said second replicator means operates to retain the data in said auxiliary loops which data is replicated to said read line so that the data in said auxiliary loops can be repeatedly read out with a reduced access time.

7. A magnetic bubble memory according to claim 1, wherein said second replicator means operates to transfer out the data in said auxiliary loops to said read line prior to the replication of the data of said minor loops to said auxiliary loops.

8. A magnetic bubble memory for accessing data sequences by the presence or absence of magnetic bubble domains, comprising:
    a plurality of minor loops for circulating the stored data sequence by driving magnetic field;
    a write line for transferring in data for updating the data sequences in said minor loops;
    gate means for coupling said write lines and one end of each of said plurality of minor loops to control data transfer therebetween;
    replicators each arranged at the other end of each of said minor loops for replicating the data sequences;
    a plurality of auxiliary loops each having one end thereof coupled to respective one of said replicators for circulating the replicated data sequences by driving magnetic field;
    a read line for transferring the data sequences to be read from said auxiliary loops; and
    read control means for coupling said read line and said auxiliary loops to control the replication of the data in said auxiliary loops to said read line.

9. A magnetic bubble memory according to claim 8 wherein said read control means has a function to transfer out the data in said auxiliary loops to said read line prior to the replication of the data of said minor loops to said auxiliary loops.

10. A magnetic bubble memory according to claim 8, wherein said read control means includes replicator means for replication of the data in said auxiliary loops to said read line.

11. A magnetic bubble memory according to claim 10, wherein said read control means controls said replicator means to operate to transfer out the data in said auxiliary loops to said read line prior to the replication of the data of said minor loops to said auxiliary loops.

12. A magnetic bubble memory according to claim 10, wherein said replicator means operates to retain the data in said auxiliary loops which data is replicated to said read line so that the data in said auxiliary loops can be repeatedly read out with a reduced access time.

* * * * *